United States Patent
Wu

(10) Patent No.: US 11,194,418 B2
(45) Date of Patent: Dec. 7, 2021

(54) TOUCH DISPLAY SCREEN AND MOBILE TERMINAL

(71) Applicant: BEIJING XIAOMI MOBILE SOFTWARE CO., LTD., Beijing (CN)

(72) Inventor: Tsangchih Wu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/696,617

(22) Filed: Nov. 26, 2019

(65) Prior Publication Data

US 2021/0026512 A1    Jan. 28, 2021

(30) Foreign Application Priority Data

Jul. 26, 2019    (CN) .......................... 201910684373.8

(51) Int. Cl.
*G06F 3/041* (2006.01)
*H01Q 1/24* (2006.01)
*H01Q 1/52* (2006.01)

(52) U.S. Cl.
CPC .......... *G06F 3/04164* (2019.05); *H01Q 1/24* (2013.01); *H01Q 1/52* (2013.01)

(58) Field of Classification Search
None
See application file for complete search history.

(56) References Cited

U.S. PATENT DOCUMENTS

| | | | |
|---|---|---|---|
| 2002/0135568 A1* | 9/2002 | Chen | G06F 3/0418 345/173 |
| 2011/0273382 A1* | 11/2011 | Yoo | H01Q 9/42 345/173 |
| 2012/0048828 A1* | 3/2012 | Kim | G06F 3/0443 216/13 |
| 2016/0062515 A1* | 3/2016 | Bae | G06F 3/0414 345/174 |
| 2016/0266690 A1* | 9/2016 | Ahn | G06F 1/16 |
| 2016/0344089 A1* | 11/2016 | Baik | H01Q 1/243 |
| 2017/0153726 A1* | 6/2017 | Lee | G06F 3/044 |
| 2017/0269440 A1* | 9/2017 | Yoshitomi | G02F 1/134309 |
| 2017/0371452 A1 | 12/2017 | Endo et al. | |
| 2018/0157358 A1* | 6/2018 | Lin | G02F 1/13338 |
| 2020/0194508 A1* | 6/2020 | Gwon | H01L 27/3262 |

OTHER PUBLICATIONS

Extended European Search Repon dated Jul. 2, 2020 in Patent Application No. 19219625.1, 8 pages.

* cited by examiner

*Primary Examiner* — Roy P Rabindranath
(74) *Attorney, Agent, or Firm* — Oblon, McClelland, Maier & Neustadt, L.L.P.

(57) ABSTRACT

The present disclosure relates a touch display screen and a mobile terminal. The touch display screen provided by exemplary embodiments of the present disclosure can include a substrate, a touch electrode, a touch trace, and an antenna assembly. The touch electrode and the touch trace cover the substrate. The touch trace is connected to the touch electrode. The antenna assembly is also arranged on the substrate and spaced apart from the touch trace by a preset distance.

13 Claims, 4 Drawing Sheets

TOUCH DISPLAY SCREEN AND MOBILE TERMINAL

CROSS-REFERENCE TO RELATED APPLICATIONS

This application is based upon and claims priority to Chinese Patent Application Serial No. 201910684373.8, filed on Jul. 26, 2019, the entire contents of which are incorporated herein by reference.

TECHNICAL FIELD

The present disclosure generally relates to the field of mobile terminals, and more particularly, to a touch display screen and a mobile terminal.

BACKGROUND

With the development of mobile terminals, full screens have become a popular development trend. A middle frame of a full-screen mobile terminal for installation of a display screen is narrowed to increase the screen-to-body ratio of the display screen. However, an antenna assembly is usually arranged at a side portion of the mobile terminal, and a distance between an antenna and the middle frame for the display screen is reduced as the middle frame for the display screen becomes larger and larger. As a result, the communication effect of the antenna can be diminished.

SUMMARY

The present disclosure provides a touch display screen and a mobile terminal to overcome defects in the related art. According to a first aspect of the present disclosure, there is provided a touch display screen that can include a substrate a touch electrode covering the substrate, a touch trace arranged on the substrate and connected to the touch electrode, and an antenna assembly arranged on the substrate and spaced apart from the touch trace by a preset distance.

In an embodiment, the touch electrode can be arranged within a range of the preset distance away from the antenna assembly. Further, the antenna assembly can be arranged in an edge area of the substrate.

In an embodiment, the touch display screen comprises a curved portion, and the antenna assembly is arranged at the curved portion. The antenna assembly can be a transparent assembly. Further, the substrate can be one of a transparent substrate plate or a transparent film layer.

In an embodiment, the touch display screen can further include a display assembly having an encapsulation layer as the substrate. Also, the touch display screen can further include a display assembly having an encapsulation layer that is arranged on the substrate.

According to a second aspect of the present disclosure, there is provided a mobile terminal having a housing and a touch display screen provided by the first aspect and mounted on the housing. In an embodiment, the housing includes a side edge and the touch display screen includes a curved portion extending to the side edge, with an antenna assembly in the touch display screen being arranged at the curved portion.

In an embodiment, the housing can include a rear cover plate, the touch display screen includes an auxiliary display portion connected to the curved portion, and the auxiliary display portion extends from an edge of the curved portion to the rear cover plate.

The touch display screen and the mobile terminal provided by the present disclosure at least have the following beneficial effects. Specifically, in embodiments of the present disclosure, the antenna assembly is arranged on the substrate of the touch electrodes and the touch traces, such that a large clearance area is provided for the antenna assembly, and influence on the antenna assembly caused by a full screen in the related art can be addressed. Moreover, in such a manner, the structural integration level of assemblies is effectively improved. When the touch display screen is mounted in the mobile terminal, space in the mobile terminal originally used for mounting the antenna assembly is saved, which satisfies a light-thin design requirement for the mobile terminal.

BRIEF DESCRIPTION OF THE DRAWINGS

The accompanying drawings, which are incorporated in and constitute a part of this specification, illustrate exemplary embodiments consistent with the disclosure and, together with the description, serve to explain the principles of the disclosure.

DETAILED DESCRIPTION

Figure 1:
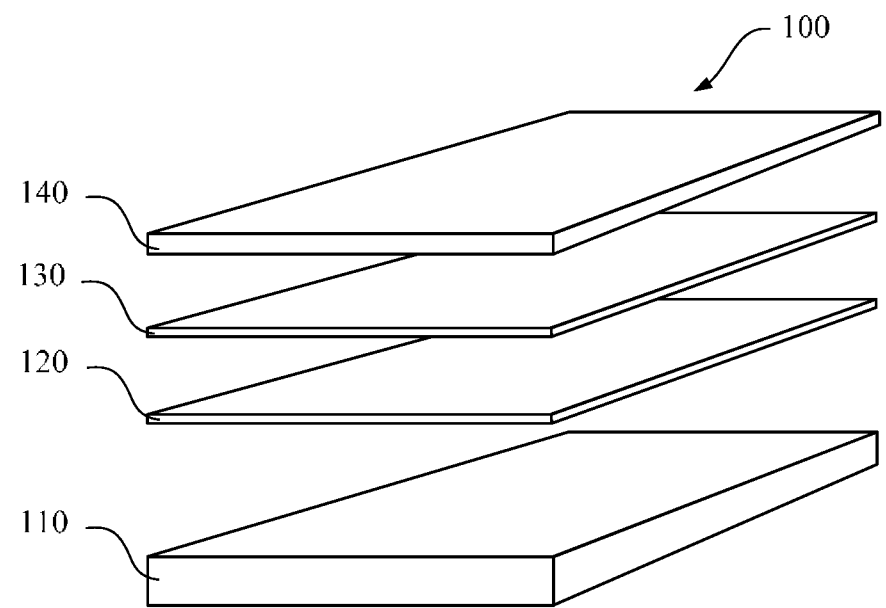
FIG. 1 is a schematic diagram of a touch display screen according to an exemplary embodiment.

Exemplary embodiments of the present disclosure will be described in detail and examples of the embodiments will be illustrated in the drawings. When the following description refers to the drawings, unless specified otherwise, the same numbers in different drawings represent the same or similar elements. The implementations described in the following exemplary embodiments do not represent all implementations consistent with the present disclosure, and instead they are merely examples of devices and methods consistent with aspects of the present disclosure as detailed in the appended claims.

The terminology used herein is for the purpose of describing particular embodiments only and is not intended to be limiting of the disclosure. Unless otherwise defined, all terms (including technical and scientific terms) used herein have the same meaning as commonly understood by one of ordinary skill in the art to which this disclosure belongs. The terms "a," "an," and the like used in the specification and the claims are not intended to limit the number but include at least one. Unless otherwise indicated, the terms "comprising" or "including" herein means that the elements or articles presenting before the terms "comprising" or "including" contain the elements or articles presenting after the terms "comprising" or "including", but do not preclude other elements or articles. The term "connected" or "coupled" and the like is not limited to physical or mechanical connection, but may be electric connection regardless of direct connection or indirect connection.

As used in the description of the present disclosure and the appended claims, "a" and "the" in singular forms mean including plural forms, unless clearly indicated in the context otherwise. It should also be understood that, as used herein, the term "and/or" represents and contains any one and all possible combinations of one or more associated listed items.

An antenna assembly constitutes an important part of a mobile terminal, and the mobile terminal performs communication by means of the antenna assembly. A certain clearance area should be reserved during arrangement of the antenna assembly, to prevent other components from affecting the communication effect of the antenna assembly. However, it is difficult to set up a sufficient clearance area with the higher and higher screen-to-body ratio of a display screen of the mobile terminal.

Figure 7:
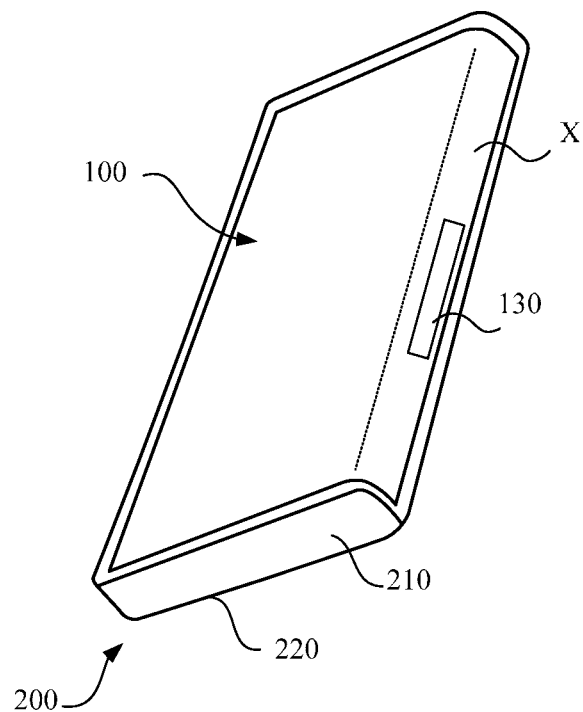
FIG. 7 is a schematic diagram of a mobile terminal according to an exemplary embodiment.
Figure 8:
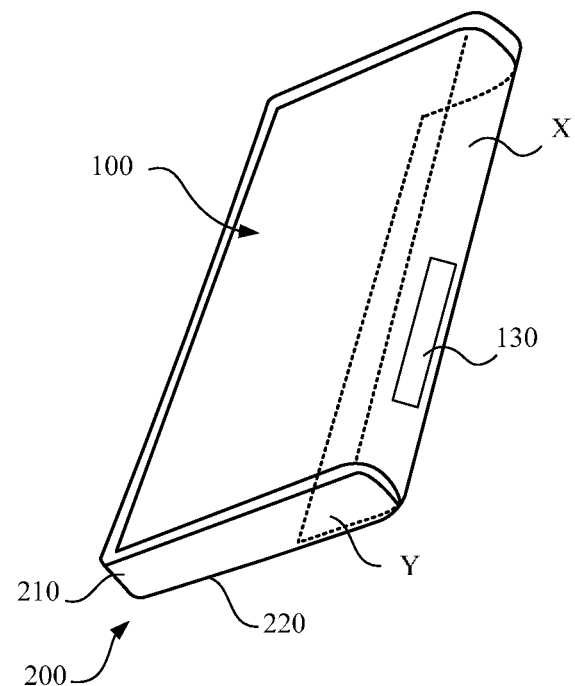
FIG. 8 is a schematic diagram of a mobile terminal according to another exemplary embodiment.

Based on the above, embodiments of the present disclosure provide a touch display screen and a mobile terminal. FIGS. 1 to 6 illustrate schematic diagrams of touch display screens provided by different exemplary embodiments. FIGS. 7 to 8 illustrate schematic diagrams of mobile terminals provided by different exemplary embodiments.

Figure 4:
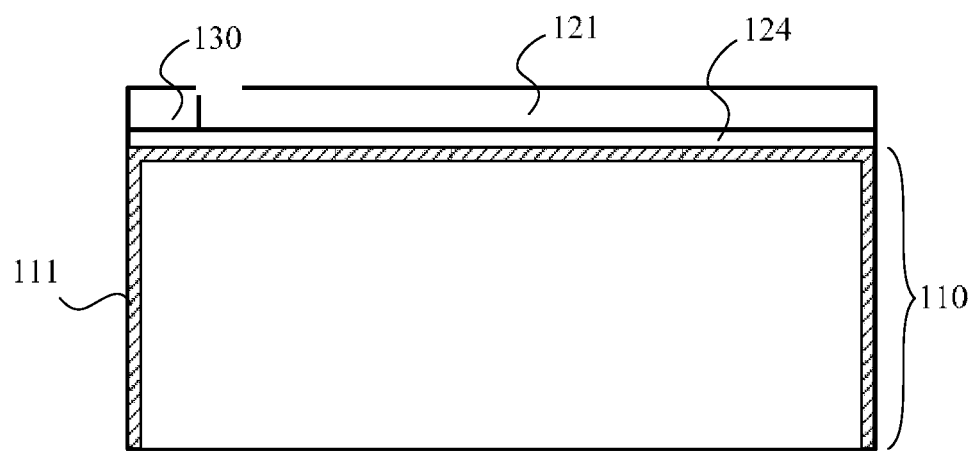
FIG. 4 is a side sectional diagram of a touch display screen according to an exemplary embodiment.
Figure 5:
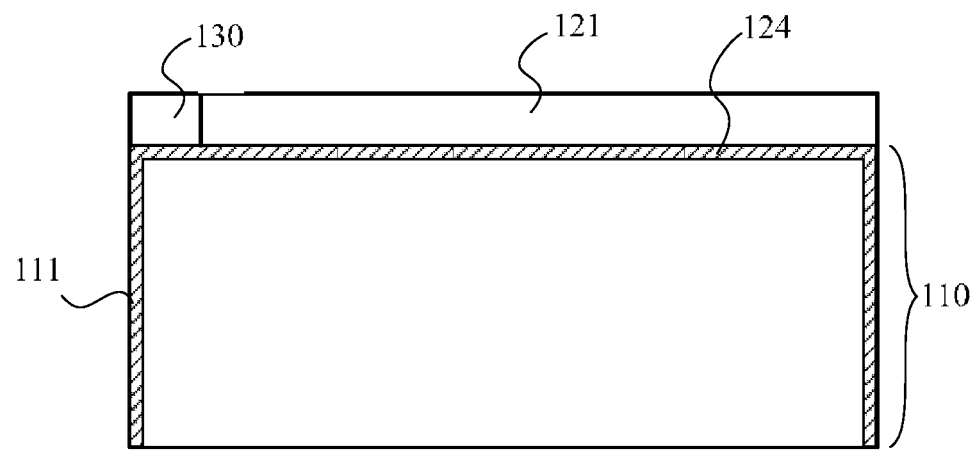
FIG. 5 is a side sectional diagram of a touch display screen according to an exemplary embodiment.

In a first aspect, embodiments of the present disclosure provide a touch display screen. As illustrated in FIG. 1, a touch display screen 100 includes a display assembly 110 that can be configured to display images. For example, the display assembly 100 can be an organic light-emitting diode (OLED) display screen or a liquid crystal display (LCD). As shown in FIGS. 4 and 5, the display assembly 110 may include an encapsulation layer 111. For example, the display assembly 110 can be encapsulated by a glass encapsulation layer 111. Alternatively, the display assembly 110 can be encapsulated by a thin film encapsulation layer 111. The encapsulation layer 111 can improve a structural stability of the display assembly 110.

Figure 2:
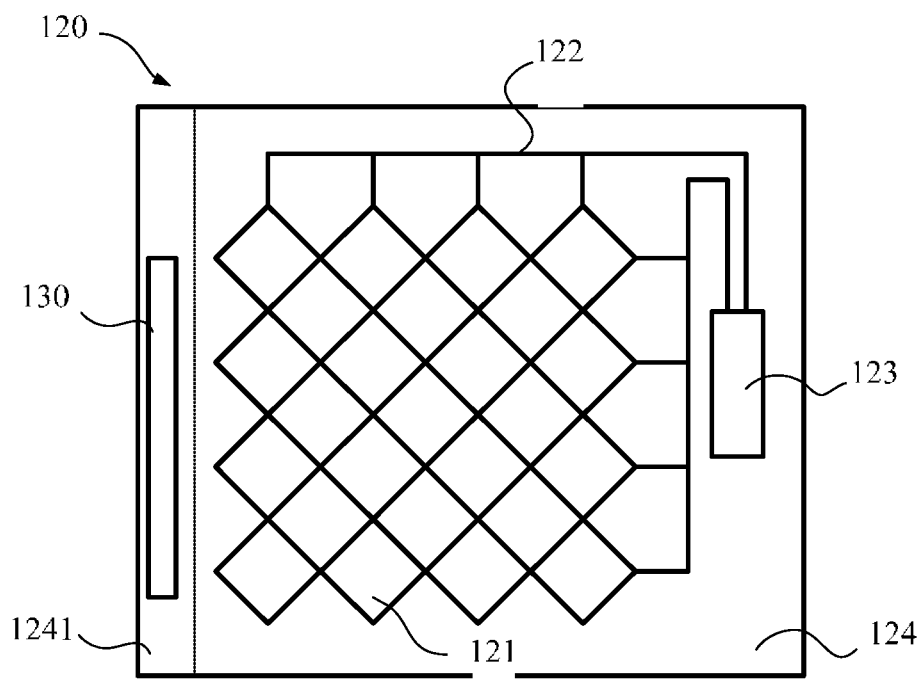
FIG. 2 is a schematic diagram of a touch layer in a touch display screen according to an exemplary embodiment.
Figure 3:
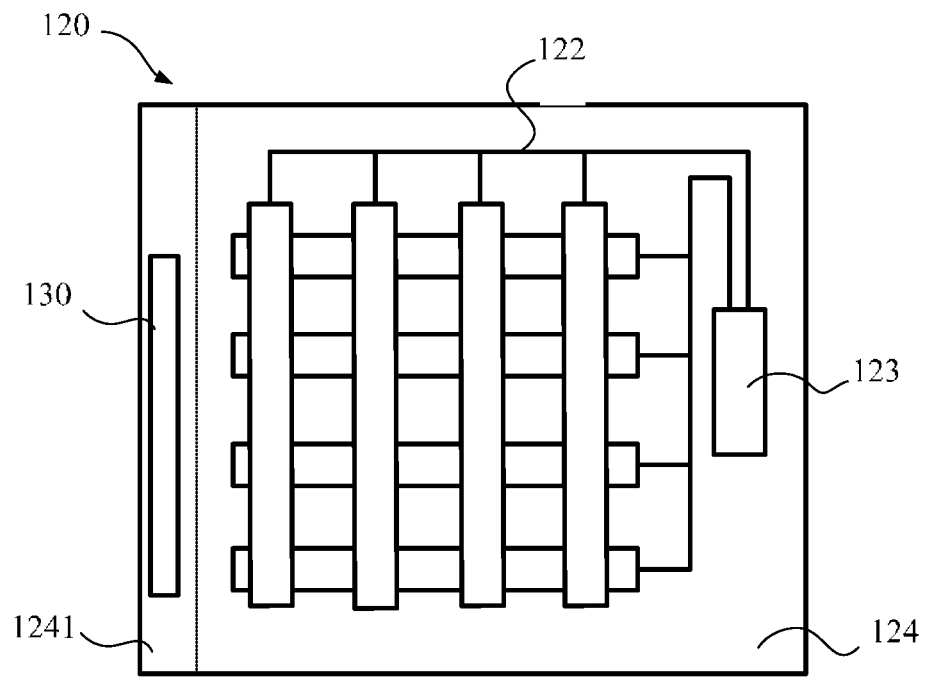
FIG. 3 is a schematic diagram of a touch layer in a touch display screen according to an exemplary embodiment.

Referring again to FIG. 1, the touch display screen 100 can further include a touch assembly 120. As illustrated in FIG. 2 and FIG. 3, the touch assembly 120 includes a touch electrode 121, a touch trace 122 connected to the touch electrode 121, and a touch chip 123 connected to the touch trace. The touch chip 123 is configured to receive a signal output by the touch electrode 121 and to implement a touch function of the touch assembly 120. The touch electrode 121 can be arranged in many ways, which will be elaborated hereinafter referring to embodiments.

As illustrated in FIG. 2, touch electrodes 121 can be in the shape of a rhombus and arranged in rows and columns. Moreover, adjacent touch electrodes 121 in the same row or column are in electrical communication (for example, by bridging connection).

As illustrated in FIG. 3, touch electrodes 121 can be in the shape of a strip and arranged in rows and columns, where the rows and columns of the touch electrodes 121 overlap.

Each row and each column of touch electrodes 121 are connected to the touch chip 123 by means of the touch traces 122. The touch electrode 121 at a contact position between an external assembly and the touch assembly 120 generates a charge change during use, and the touch chip 123 receives the position information of the charge change by means of the touch trace 122, thereby implementing a touch operation.

Moreover, the touch assembly 120 further includes a substrate 124. The touch electrode 121 and the touch trace 122 are arranged on the substrate 124. Optionally, the substrate 124 is a transparent thin film layer, or the substrate 124 is a transparent substrate plate, such as a glass plate.

Regarding the implementation of the substrate 124, optionally, as illustrated in FIG. 4, the substrate 124 is one of components of the touch assembly 120 and arranged on the encapsulation layer 111 of the display assembly 110. In such a manner, the touch assembly 120 is independent from the display assembly 110, and it is convenient to replace and maintain assemblies when one of the touch assembly 120 and the display assembly 110 fails.

Optionally, as illustrated in FIG. 5, the substrate 124 is part of the encapsulation layer 111 of the display assembly 110. In such a manner, the display assembly 110 and the touch assembly 120 share the encapsulation layer 111, which improves the structural integration level of the touch display screen 100 and helps to reduce the thickness of the whole touch display screen 100, thereby optimizing user experience.

In embodiments of the present disclosure, as illustrated in FIG. 2 and FIG. 3, the touch display screen 100 further includes an antenna assembly 130 arranged on the substrate 124. As shown, the antenna assembly 130 is space apart from the touch trace 122 by a preset distance so that they do not affect each other's operation. The preset distance can be the closest distance that the antenna assembly 130 is arranged away from the touch trace 122, where there is little or no mutual influence between the antenna assembly 130 and the touch trace 122. For example, in some embodiments the preset distance can range from 3 mm to 10 mm or the like.

Moreover, optionally, the antenna assembly 130 can be a transparent assembly made from a transparent material, to guarantee a normal display function of the touch display screen 100.

In embodiments of the present disclosure, the antenna assembly 130 can be arranged in the touch assembly 120. In such a manner, when a full screen is employed, the antenna assembly 130 can have a sufficient clearance area. Moreover, the structural integration level of assemblies can be improved. When the touch display screen 100 is mounted in a mobile terminal, a space in the mobile terminal originally used for mounting the antenna assembly 130 is saved, which helps to realize a light-thin design of the mobile terminal.

In an embodiment, no touch electrode 121 is arranged on the substrate 124 within the range of the preset distance from the antenna assembly 130. In such a manner, mutual influence among the touch electrode 121, the touch trace 122, and the antenna assembly 130 can be further avoided.

As an example illustrated in FIG. 2 and FIG. 3, the antenna assembly 130 is arranged in an edge area 1241 of the substrate 124. Usually, the touch electrode 121 is arranged in a middle area of the substrate 124, so it is convenient to reserve a sufficient space in the edge area 1241 for arranging the antenna assembly 130. Moreover, optionally, the arrangement of the touch trace 122 in the edge area 1241 and the arrangement of the touch electrode 121 adjacent to the edge area 1241 are adjusted to reserve the clearance area for mounting the antenna assembly 130.

Usually, when a user uses the touch display screen 100, there are fewer touch operations at an edge of the touch assembly 120. Therefore, the appropriate removal of the touch electrode 121 at the edge area 1241 of the substrate 124 does not affect the touch operations on the touch display screen 100, and guarantees that the antenna assembly 130 has the sufficient clearance area.

Figure 6:
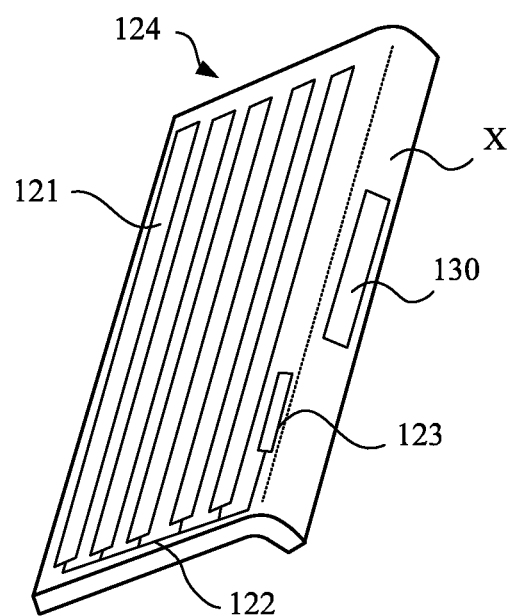
FIG. 6 is a schematic diagram of a touch display screen according to another exemplary embodiment.

As an example illustrated in FIG. 6, the touch display screen 100 includes a curved portion X. In such a case, the touch display screen 100 is bent as a whole, that is, the display assembly 110 (not illustrated in FIG. 6) and the substrate 124 both include curved portions. In such a case, the antenna assembly 130 is arranged on the curved portion X.

Moreover, optionally, the touch electrode 121 on the curved portion X is removed, and the arrangement of the touch trace 122 is adjusted, so as to evade the antenna assembly 130. In such a manner, the curved portion X only has a display function but no touch function (for example, the curved portion can display icons such as power, weather, time, etc., or display a designated image). When the touch display screen 100 is arranged in the mobile terminal, the curved portion X is optionally located at a side edge of the mobile terminal. When the user holds the mobile by hand, the user may easily touch the side edge of the mobile terminal, so the influence caused by unintended touch can be avoided by removing the touch function of the curved portion X. In such a manner, the antenna assembly 130 can be arranged reasonably and the user experience of the touch display screen 100 can be optimized.

It should be noted that, the curved portion X can also be located at an edge or a middle position of the touch display screen 100.

In addition, as illustrated in FIG. 1, a polarized assembly 140 and a protective cover 150 further cover the touch assembly 120 to guarantee the use effect and structural safety of the touch display screen 100.

A second aspect of the present disclosure provides a mobile terminal. Optionally, the mobile terminal is a mobile phone, a tablet computer, a wearable device (such as a bracelet, a watch, etc.), an in-vehicle device, a medical device, and the like having a display panel. The drawings only illustrate the mobile phone for ease of explanation.

As illustrated in FIG. 7 and FIG. 8, the mobile terminal includes a housing 200, and the touch display screen 100 provided by the above first aspect. The housing 200 includes a side edge 210 and a rear cover plate 220, and the side edge 210 and the rear cover plate 220 defines a mounting chamber. The touch display screen 100 is mounted on the housing and seals the mounting chamber, thereby forming a display surface.

Moreover, a controller of the mobile terminal is mounted in the mounting chamber. Optionally, the antenna assembly 130 is connected to the controller in the mounting chamber by means of a flexible printed circuit board to implement the communication function of the mobile terminal.

For the mobile terminal provided by embodiments of the present disclosure, the high screen-to-body ratio and the sufficient clearance area for the antenna assembly 130 are both taken into account, and the high-quality communication of the mobile terminal is ensured. Moreover, the structural integration level of the overall terminal is higher, and the light-thin design can be achieved.

In an embodiment as illustrated in FIG. 7, in combination with FIG. 6, the touch display screen 100 includes the curved portion X extending to the side edge 210 of the mobile terminal. The antenna assembly 130 is arranged in the curved portion X. Preferably, a portion of the touch display screen 100 corresponding to the curved portion X is provided with neither touch electrode 121 nor touch trace 122. In such a manner, potential inadvertent operation caused by touching the curved portion X when the user holds the mobile terminal by hand can be avoided. Moreover, since the antenna assembly 130 is arranged at the curved portion X, a larger clearance area can be achieved to guarantee the use effect.

Furthermore, as illustrated in FIG. 8, the touch display screen 100 can include an auxiliary display portion Y connected to the curved portion X. The auxiliary display portion Y extends from an edge of the curved portion X to the rear cover plate of the housing 200. In such a case, the antenna assembly 130 is also arranged at the curved portion X. In such a case, a touch operation area of the touch display screen 100 is enlarged, and the use effect of the antenna assembly 130 is guaranteed.

It should be noted that, in embodiments of the present disclosure, the touch display screen 100 is a complete assembly with an integral structure, and the curved portion X and the auxiliary display portion Y are both made by a curving or bending process.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and embodiments be considered to be exemplary, with a true scope of the disclosure being indicated by the following claims.

What is claimed is:

1. A touch display screen; comprising:
   a substrate;
   a touch electrode covering the substrate;
   a touch trace arranged on the substrate and connecting the touch electrode to a touch chip; and
   an antenna assembly arranged on an edge area of the substrate and spaced apart from the touch trace by a preset distance in a direction parallel to the substrate, the antenna assembly and the touch trace being located on different sides of the substrate.

2. The touch display screen of claim 1, wherein the touch display screen comprises a curved portion, the edge area of the substrate comprises the curved portion, and the antenna assembly is arranged at the curved portion.

3. The touch display screen of claim 1, wherein the antenna assembly is a transparent assembly.

4. The touch display screen of claim 1, wherein the substrate is a transparent substrate plate or a transparent film layer.

5. The touch display screen of claim 1, wherein the touch display screen further comprises a display assembly having an encapsulation layer that is the substrate.

6. The touch display screen of claim 1, wherein the touch display screen further comprises a display assembly having an encapsulation layer that is arranged on the substrate.

7. A mobile terminal, comprising:
   a housing; and
   a touch display screen mounted on the housing, wherein the touch display screen includes:
      a substrate;
      a touch electrode covering the substrate;
      a touch trace arranged on the substrate and connecting the touch electrode to a touch chip; and
      an antenna assembly arranged on an edge area of the substrate and spaced apart from the touch trace by a preset distance in a direction parallel to the substrate, the antenna assembly and the touch trace being located on different sides of the substrate.

8. The mobile terminal of claim 7, wherein the housing further comprises a side edge, and the touch display screen further comprises a curved portion extending to the side edge, wherein the edge area of the substrate comprises the curved portion, and the antenna assembly in the touch display screen is arranged at the curved portion.

9. The mobile terminal of claim 8, wherein the housing further comprises a rear cover plate, and the touch display screen further comprises an auxiliary display portion connected to the curved portion that extends from an edge of the curved portion to the rear cover plate.

10. The mobile terminal of claim 7, wherein the antenna assembly is a transparent assembly.

11. The mobile terminal of claim 7, wherein the substrate is a transparent substrate plate or a transparent film layer.

12. The mobile terminal of claim 7, wherein the touch display screen further comprises a display assembly having an encapsulation layer that is the substrate.

13. The mobile terminal of claim 7, wherein the touch display screen further comprises a display assembly having an encapsulation layer that is arranged on the substrate.

\* \* \* \* \*